United States Patent [19]

Fujisawa et al.

[11] Patent Number: 5,140,281
[45] Date of Patent: Aug. 18, 1992

[54] AMPLIFIER CIRCUIT

[75] Inventors: Masanori Fujisawa, Kumagaya; Hiroshi Kojima, Gunma, both of Japan

[73] Assignee: Sanyo Electric Co., Ltd., Osaka, Japan

[21] Appl. No.: 751,943

[22] Filed: Aug. 29, 1991

[30] Foreign Application Priority Data

Aug. 30, 1990 [JP] Japan .................................. 2-230435

[51] Int. Cl.$^5$ .............................................. H03F 3/45
[52] U.S. Cl. ..................................... 330/261; 330/257; 330/255
[58] Field of Search .......................... 330/261, 257, 259

[56] References Cited

U.S. PATENT DOCUMENTS

| | | | |
|---|---|---|---|
| 3,904,972 | 9/1975 | Seki et al. | 330/261 |
| 4,072,907 | 2/1978 | Sekiya et al. | 330/261 |
| 4,194,136 | 3/1980 | Butler | 330/261 |
| 4,335,358 | 6/1982 | Hoeft | 330/263 |
| 4,543,538 | 9/1985 | Fay | 330/261 |

Primary Examiner—Eugene R. LaRoche
Assistant Examiner—Tan Dinh
Attorney, Agent, or Firm—Armstrong, Nikaido, Marmelstein, Kubovcik & Murray

[57] ABSTRACT

An offset voltage at one pair of differential amplifier transistors for effecting the differential amplification of an input signal is suppressed. To achieve this aim, the base current of a pair of differential amplifier transistors is supplied from a current generator circuit separately provided. This current generator circuit has a very small current flow, and is composed of another pair of differential amplifier transistors to which a reference voltage identical with the bias voltage of the first differential amplifier transistors is applied, a transistor for reference current use for delivering a current at a current density identical with the current density of the first differential amplifier transistors, a base current supply transistor for supplying power to the reference current transistor, and two current supply transistors for delivering a current identical with the current of the simulation base-current supply transistor. The transistors of the second differential amplifier act to make the base potential of the transistor for operation simulation use identical with a reference voltage, and then the simulation base current supply transistor supplies the base current to the operation simulation transistor. Thereafter, since the transistor for base current supply use delivers an identical current to the base current from the simulation base current supply transistor, the occurrence of the offset voltage in the differential amplifier transistors can be suppressed.

5 Claims, 3 Drawing Sheets

AMPLIFIER CIRCUIT

BACKGROUND OF THE INVENTION

1. Field of the Invention:

This invention relates to an amplifier circuit for amplifying an input signal, and more particularly to an amplifier circuit capable of suppressing an output d.c. offset voltage to a minimum.

2. Description of the Related Art:

Heretofore, there have been known various types of amplifier circuits. FIG. 3 of the accompanying drawings shows the structure of a common amplifier circuit. In FIG. 3, the amplifier circuit 1 is comprised mainly of an amplifier A3 and a negative feedback resistor R3.

In the circuit 1, a signal input terminal 2 is connected to the non-inverting input of the amplifier A3, and the inverting input of the amplifier A3 is connected to D.C. power 6 via a capacitor C1. The output of the amplifier A3 is connected to a signal output terminal 5 having a capacitor C3 and a resistor R6 connected thereto as the load. The negative feedback resistor R3 is connected across the output and the inverting input terminal of the amplifier A3, and a capacitor C2 and a resistor R7 are connected in parallel with the resistor R3.

A signal input at the input terminal 2 is supplied to the non-inverting input terminal of the amplifier A3, and is delivered to the loads from the output terminal 5 after having been amplified at a gain level determined by the ratio of the resistor R3 to the resistor R5. In this example, d.c. components of the signal are cut off by the capacitor C3, and a.c. components of the signal are applied to the resistor.

Assume that a current flowing through the resistor R2 is Ii, and a current flowing through the resistor R3 is If. Given that Ii and If are 0.5 μA, the resistor R3 is 300KΩ, the resistor R2 is 30KΩ and the voltage of the d.c. power supply 6 is Vref, a potential VinDC at the positive input terminal of the amplifier A3 is given by the following equation:

$$VinDC = -(R2 \times Ii) + Vref \quad (1)$$
$$= -15 \text{ mV} + Vref.$$

At this time, an output potential VoDC of the amplifier A3 is expressed by the equation:

$$VoDC = (R3 \times If) + Vref \quad (2)$$
$$= 150 \text{ mV} + Vref$$

Hence, the output d.c. offset voltage VoDCof is given as $$VoDC - VinDC = 165 \text{ mV}.$$

As described above, in the conventional amplifier circuit, when the amplifier circuit is operated at a low voltage power, e.g. 1.5 V or thereabouts, the output d.c. voltage of the amplifier A3 suffers from many fluctuations even if the output d.c. offset voltage is 165 mV, thereby reducing the dynamic range of the circuit and decreasing the maximum output.

Particularly, when increasing the gain level, a plurality of the transistors set forth in the above are connected in series to form a multistage amplifier in many cases. Such a circuit configuration, however, causes the foregoing offset voltage to be amplified at each stage, reducing effective amplification. Further, in order to prevent such a disadvantage as mentioned above, the amplifier circuits may be connected to each other by way of a capacitor. With such a structure, the d.c. components may be eliminated at the input side of each amplification stage, so that the amplification of the offset voltage is prevented. Since the capacitor occupies a much wider space than other elements, it becomes impossible to integrate the amplifier. Therefore, the structure accommodating the capacitor is not suitable for integrated circuit type amplifier. In addition, in an apparatus for reproducing an audio signal, it is necessary to prevent the attenuation of signals in the low-frequency band in the amplifier circuit in order to reproduce the signal with a high fidelity. For this reason, a large capacitor is required in the amplifier for connecting between circuits, which renders the integration of the amplifier circuit difficult.

This invention is aimed at overcoming the aforementioned drawbacks in the related art, and an object of this invention is to provide an amplifier circuit capable of suppressing an output d.c. offset voltage to a minimum, and having a greater stability.

SUMMARY OF THE INVENTION

To this aim, according to one aspect of this invention, there is provided an amplifier comprising:

(a) a first differential amplifier circuit for issuing an output signal by differentially amplifying an input signal, the first differential amplifier circuit including, a first transistor having a base to which the input signal is inputted, a second transistor having the emitter connected to the emitter of the first transistor, and a first power transistor, having the collector connected to the common emitters of the first and the second transistors, for determining the amount of current which flows in both the first and the second transistors;

(b) a second differential amplifier circuit for issuing an output in response to the reference voltage signal, the second differential amplifier circuit including, a third transistor having the reference voltage signal supplied to the base thereof, a fourth transistor having the emitter connected to the emitter of the third transistor, and a second power transistor, having the collector connected to the common emitters of the third and the fourth transistors, for determining the amount of current which flows in both the third and fourth transistors; and (c) a current generator circuit for supplying to the first and second transistors a base current in response to the output signal from the second differential amplifier circuit, the current generator circuit including, a fifth transistor connected to the base of the fourth transistor for supplying a current larger than the current flowing through the fourth transistor, a sixth transistor for supplying a base current to the fifth transistor in response to the output signal of the second differential amplifier circuit, and seventh and eighth transistors having the emitter and the base common to the sixth transistor for supplying a current in both the first and second transistors.

Upon inputting the reference voltage to the second differential amplifier circuit, an optimum base current in response to the output from the second amplifier circuit is supplied to the fifth transistor, and the same base current is also supplied to both the first and second transistors. Such a configuration permits an accurate supply of the same current to both to the first and second transistors, both of which effect the differential amplification of the signal. As a result of this, variations in the current amplification factor of the transistor for differential amplification and the offset value may be suppressed independently of the resistor inserted in the input route and the negative feedback resistor.

The amplifier circuit having the configuration described above is substantially effective for use in compact audio equipment such as a personal stereo system, which is driven by a low voltage power, e.g., a dry battery, and employs multistage amplification.

Preferably, the third power transistor is disposed at downstream of the fifth transistor for determining the current flow rate of the fifth transistor, and the third power transistor delivers half the current of the first power transistor to the fifth transistor.

Thus, the optimum base current at the fifth transistor may be supplied to the first and second transistors. The amount of current of the second power transistor may be selected to be less than 1/5 that of the third power transistor.

The amount of current which flows through the fourth transistor becomes less than that of the fifth transistor, and almost all of the current flowing through the sixth transistor is transferred to the base of the fifth transistor. Subsequently, the base current of the first and second transistor may be selected with high accuracy. Moreover, the multistage amplifier consisting of such amplifiers may effect a large current amplification with a low voltage drive.

The above and other advantages, features and additional objects of this invention will be manifest to those who are versed in the art upon making reference to the following detailed description and the accompanying drawings in which a preferred embodiment incorporating the principles of this invention is shown by way of an illustrative example.

DETAILED DESCRIPTION OF THE PREFERRED EMBODIMENTS

A preferred embodiment of this invention will now be described with reference to the accompanying drawings.

Description of the circuit configuration

Figure 1:
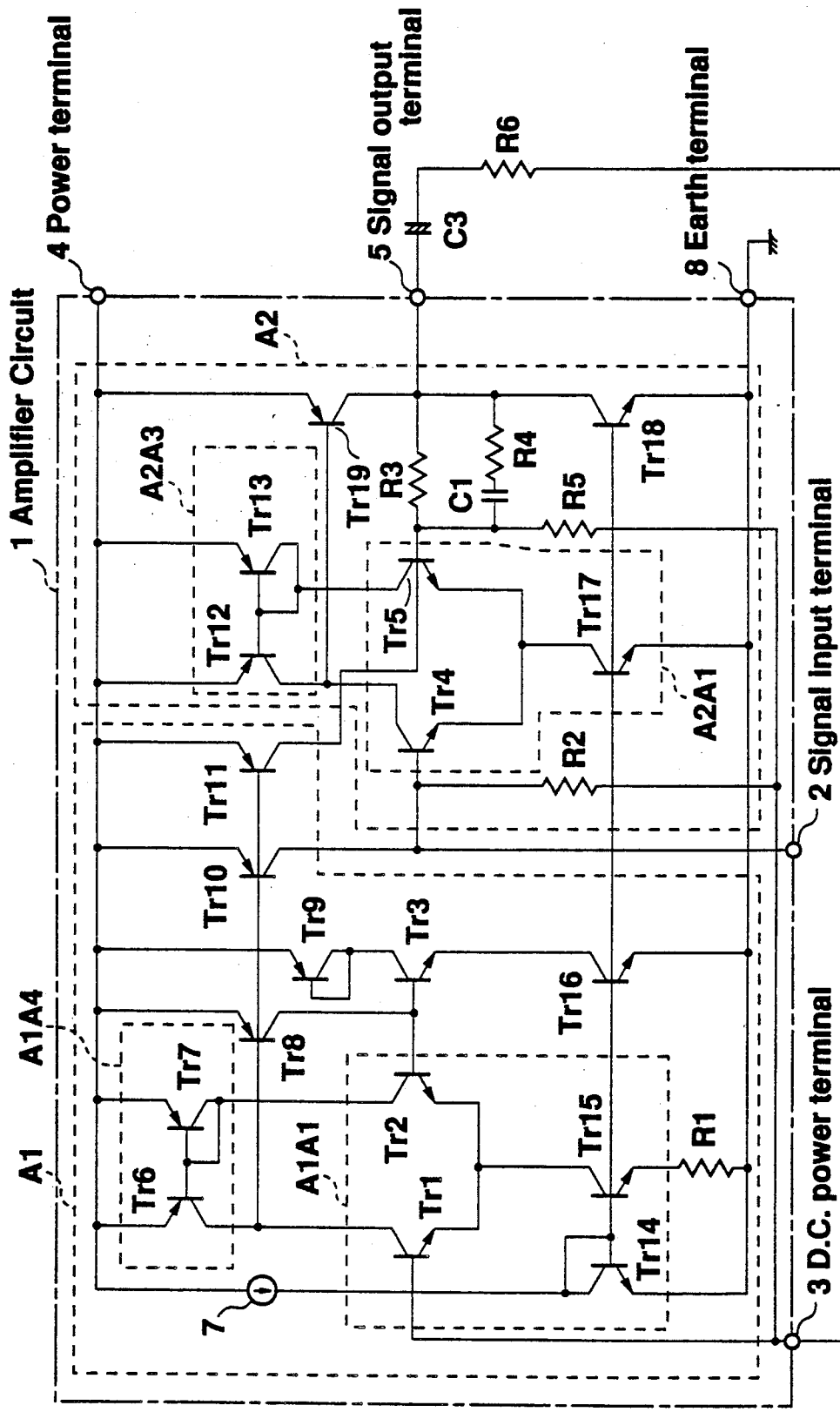
FIG. 1 is a circuit diagram illustrating an amplifier circuit according to one embodiment of this invention.

Referring to FIG. 1, an amplifier circuit 1 is chiefly composed of a base current generator circuit A1 and a main amplifier A2.

The base current generator circuit A1 substantially includes a differential amplifier circuit A1A1, a current mirror circuit A1A4, a fifth transistor Tr3, a transistor Tr6, a transistor Tr7, a sixth transistor Tr8, a seventh transistor Tr10, and an eighth transistor Tr11.

The differential amplifier circuit A1A1 is comprised of a third transistor Tr1, a fourth transistor Tr2, a transistor Tr14, and a second power transistor Tr15.

The current mirror circuit A1A4 includes a transistor Tr6 and the transistor Tr7.

The main amplifier A2 substantially includes a differential amplification circuit A2A1, a current mirror circuit A2A3, and an output transistor Tr19.

The differential amplifier circuit A2A1 is composed of the first transistor Tr4, the transistor Tr5, and the first power transistor Tr17.

The current mirror circuit A2A3 includes a transistor Tr12 and a transistor Tr13.

In the circuit, a terminal 2 is a signal input terminal; 3, a d.c. power terminal; 4, a power terminal; 5, a signal output terminal; and 8, an earth terminal.

Description of circuit connection

In the main amplifier circuit A2, the signal input terminal 2 is connected to the base of the transistor Tr4 of the differential circuit A2A1; the collector of the transistor Tr4 is connected to the collector of the transistor Tr12 and the base of the transistor Tr19; the collector of the transistor Tr5 is connected to the collector and base of the transistor Tr13 and the base of Tr12; the emitters of the transistors Tr4 and Tr5 are connected to the collector of the transistor Tr17; the base of the transistor Tr5 is connected to the signal output terminal 5 via the resistor R3; the signal output terminal 5 is further connected to the collectors of both transistors Tr19 and Tr18; the emitters of both transistors Tr18 and Tr17 are connected to an earth terminal 8; the base of the transistor Tr18 is connected to the base of the transistor Tr17. The emitters of the transistors Tr12, Tr13 and Tr 19 are connected to the power terminal 4; and the bases of Tr4 and Tr5 are connected to the d.c. power terminal 3 via the resistors R2 and R5, respectively.

In the base current generator circuit A1, the d.c. power 6 is connected to the base of the transistor Tr1 via the d.c. power terminal 3; the emitters of both transistors Tr1 and Tr2 are connected to the collector of the transistor Tr15; the emitter of the transistor Tr15 is connected to the earth terminal 8 via the resistor R1; the collector of the transistor Tr1 is connected to the collector of the transistor Tr6 and also to the bases of the transistors Tr8, Tr10, and Tr11; the collector of the transistor Tr2 is connected to the collector-base of the transistor Tr7 and the base of Tr6; the emitters of the transistors Tr6, Tr7, Tr8, Tr9, Tr10 and Tr11 are connected to the power terminal 4; the collector of the transistor Tr8 is connected to the bases of the transistors Tr2 and Tr3; the collector of the transistor Tr3 is connected to the collector-base of the Tr9; the emitter of the transistor Tr3 is connected to the collector of the transistor Tr16; the emitters of the transistors Tr16 and Tr14 are connected to the earth terminal 8; the collector-base of the transistor Tr14 and the base of transistor Tr15 are connected to the power terminal 4 via the constant power source 7; also, the bases of the transistors Tr14, Tr15, and Tr16 are common to the bases of transistors Tr17 and Tr18 of the main amplifier circuit A2.

Between the base current generator circuit A1 and the main amplifier circuit A2, the collector of the transistor Tr10 of the base current generator circuit A1 is connected to the base of the transistor Tr4 of the main amplifier A2, and the collector of the transistor Tr11 of the base current generator circuit A1 is connected to the base of the transistor Tr5 of the main amplifier A2.

Description of the circuit operation

A signal input at the signal input terminal 2 is delivered to the base of the transistor Tr4. At the bases of the transistors Tr4 and Tr5 is supplied the d.c. bias voltage Vref from the d.c. power source 6 through the resistors R2 and R5, respectively. The input signal is differentially amplified by the transistors Tr4 and Tr5, and transferred to the transistor Tr19. Variations in the current value of this transistor Tr19 are supplied to the resistor R6 through the signal output terminal 5 and the capacitor C3. The amplification degree of the amplifier circuit is determined by the ratio of the resistor R3 for negative feedback to the resistor R5.

A current IB4 is delivered to the base of the transistor Tr4 from the collector of the transistor Tr10. Since a current IB5 the same as the current IB4 is also supplied from the collector of the transistor Tr11 to the base of the transistor Tr5, no base current for the transistors Tr4 and Tr5 flows through the resistors R2, R3, and R5 unless there is an input signal, preventing the occurrence of a voltage drop at the resistors R2 and R3. Consequently, it becomes possible to suppress the offset of the output d.c. voltage of the main amplifier A2 to a minimum.

The current to be delivered to the bases of the transistors Tr4 and Tr5 from the collectors of the transistors Tr10 and Tr11 is supplied in the manner as described below.

First, the area ratio of the entire of the transistor Tr6 to the emitter of the transistor Tr7 is selected to be 1:2, and transistors having the same characteristics are used for the transistors Tr4, Tr5, and Tr3. With such a configuration, the circuit consisting of the transistors Tr9, Tr3, and Tr16 becomes equivalent to either the circuit consisting of the transistors Tr12, Tr4, and Tr17 or the circuit consisting of the transistors Tr13, Tr5, and Tr17. If a base voltage is applied to the transistor Tr3 in such a manner that the base current of the transistor Tr3 becomes the same as that of the transistors Tr4 and Tr5, that is, the voltage Vref of the d.c. power source 6, the transistor Tr3 is stabilized at the same conditions as the transistors Tr4 and Tr5. Hence, the base current equivalent to that delivered to the transistor Tr3 is supplied to both the transistors Tr4 and Tr5.

The base current of the transistor Tr3 is supplied from the transistor Tr8, and the amount of supply current of the transistor Tr8, i.e. the amount of collector current, is determined by the differential amplifier circuit A1A1. Specifically, the reference voltage Vref of the d.c. power supply is supplied to the base of the transistor Tr1of the differential amplifier circuit A1A1. This differential amplifier circuit A1A1 acts to make the base potential of the transistor Tr2 the same as the reference voltage Vref, and then the amount of current of the transistor Tr8 is determined to match with the base potential of the transistor Tr2. Substantially, most of the current of the transistor Tr8 flows through the transistor Tr3, as will be described later. Accordingly, the amount of current of the transistor Tr8 will be optimum when the base potential of the transistor Tr3 is equivalent to the reference voltage Vref. At this time, a virtually the same amount of current flows through the transistors Tr10 and Tr11, both of which have the base and emitter respectively connected to the counterparts of the transistor Tr8, and an optimum base current may be supplied to both transistors Tr4 and Tr5.

The current of the transistor Tr8 is further supplied to the transistor Tr2 as a base current, but this base current is limited to an amount which is negligible when compared with the base current of the transistor Tr3 as mentioned below.

In detail, the collector current ratio of the transistor Tr15 to the transistor Tr16 is set to 1:5 or thereabouts by reducing the amount of current in the transistor Tr15 with the addition of the resistor R1 at the emitter of the transistor Tr15. As a result of this, the base current ratio of the transistor Tr2 to the transistor Tr3 becomes 1:10 or thereabouts, so that the base current of the transistor Tr2 is reduced so as to be negligible when compared with the base current of the transistor Tr3. Subsequently, the collector current of the transistor Tr8 will be almost equivalent to the base current of the transistor Tr3.

The smaller the amount of current selected for the transistor Tr15, the more precisely the amount of current can be set.

Both the bases and the emitters of Tr10 and Tr11 are respectively connected to the base and emitter of transistor Tr8, hence the collector current of the transistor Tr8 becomes equivalent to the collector current of the transistors Tr10 and Tr11, whereby an optimum base current is supplied from the transistors Tr10 and Tr11 to the transistors Tr4 and Tr5, respectively.

Most of base current of the transistors Tr4 and Tr5 is delivered from the collectors of the transistors Tr10 and Tr11, and no current flows through the resistors R2, R3, and R5, thereby preventing the occurrence of the output d.c. offset voltage.

Here, the transistor Tr9 functioning as a diode serves to prevent the occurrence of variations in the emitter current of the transistors Tr3, Tr4, and Tr5 due to the Early Effect (the increase in an emitter current in accordance with the increase in a collector-base voltage).

In addition, in the amplifier circuit according to this invention, the plurality of transistors, e.g. Tr3, Tr4, and Tr5, must have identical characteristics. Transistors having identical such characteristics cannot be obtained using discrete components. However, the integration of circuits enable the characteristics of the transistors to be easily made identical by positioning the transistors in close proximity to each other. Thus, the amplifier circuit according to this invention is advantageous for use with an IC.

Figure 2:
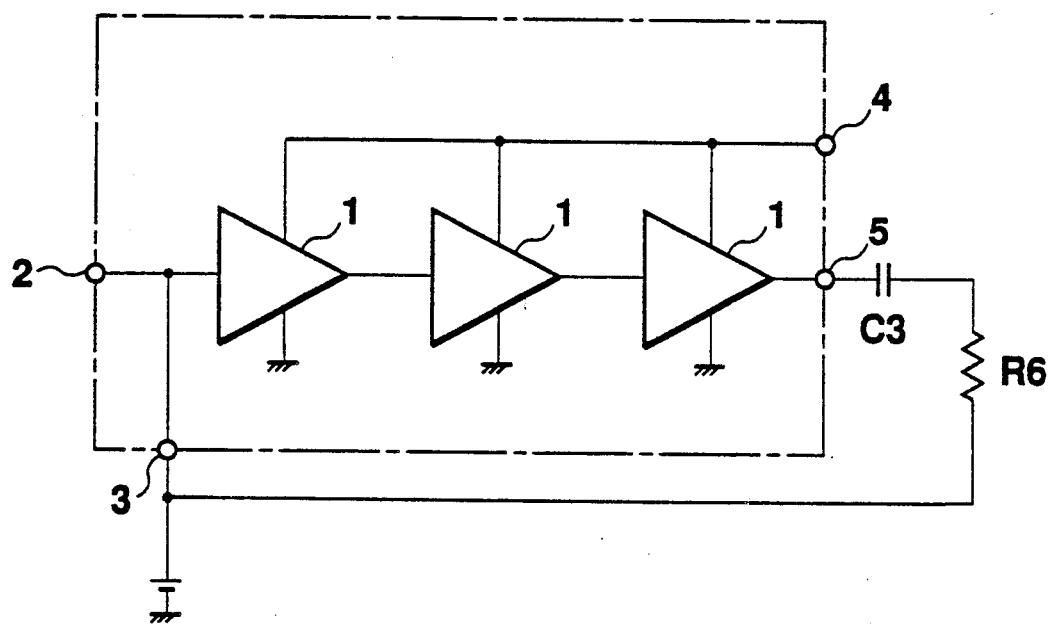
FIG. 2 is a circuit diagram of an example of multistage amplifier circuit composed of amplifier circuits of FIG. 1.
Figure 3:
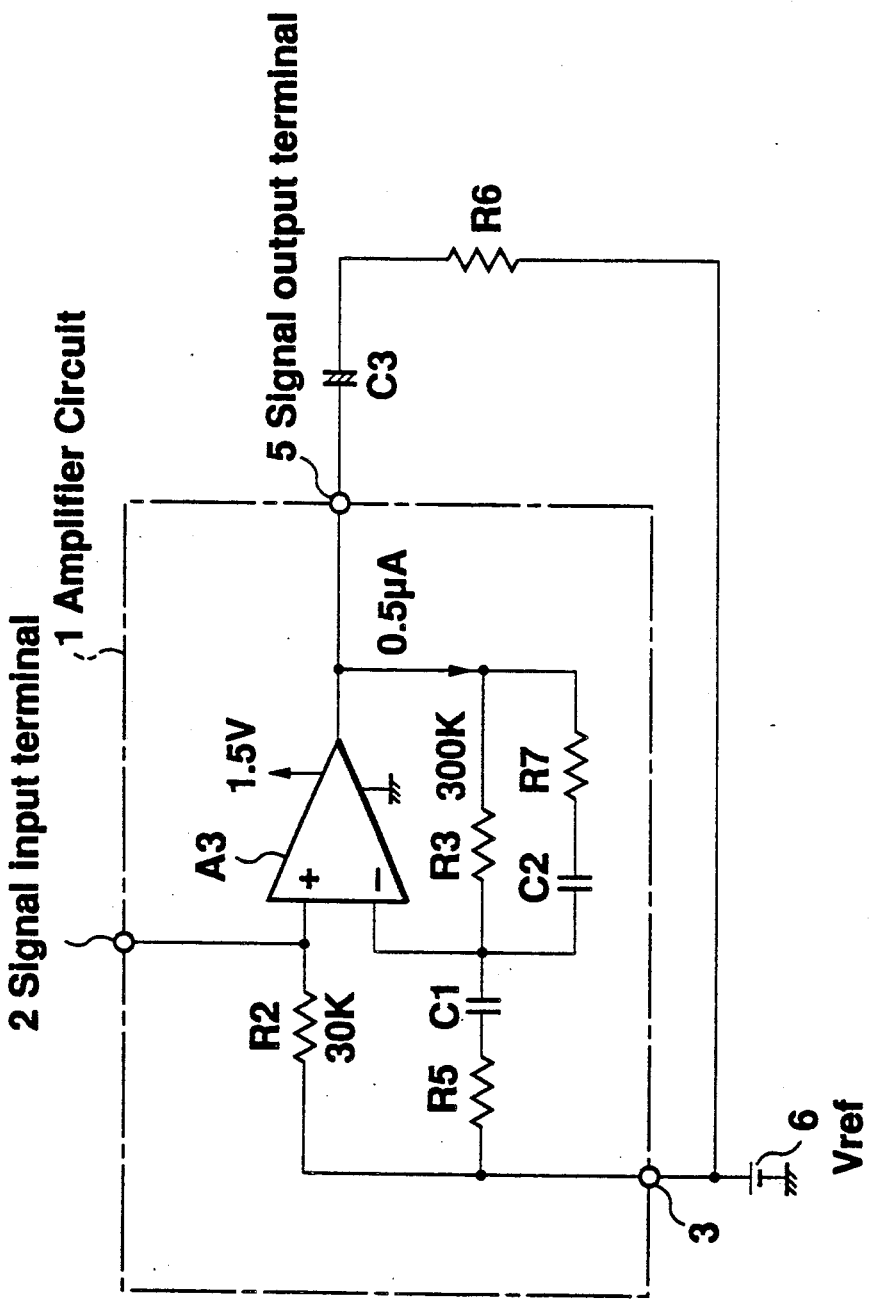
FIG. 3 is a circuit diagram of a conventional amplifier circuit.

FIG. 2 is an example of the structure of a multistage amplifier composed of a plurality of amplifier circuits 1. In this example, three amplifier circuits 1 are connected in series. In the case where the multistage amplifier is composed of a plurality of amplifier circuits 1, an offset voltage itself will be amplified when the offset occurs. The use of the amplifier circuit according to this invention allows the amplification factor to be set to a larger value with the offset minimized.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention will, without departing from the spirit and scope of the invention, be apparent to persons skilled in the art.

What is claimed is:
1. An amplifier circuit comprising:

(a) a first differential amplifier circuit for outputting a signal by differentially amplifying an input signal, the first differential amplifier circuit including,
a first transistor being supplied with the input signal at its base,
a second transistor having the emitter connected to the emitter of the first transistor, and
a first current source transistor having the collector connected to the common emitters of the first and second transistors for determining the amount of current which flows in both the first and second transistors;

(b) a second differential amplifier circuit for outputting a signal in response to a reference voltage, the second differential amplifier circuit including,
a third transistor which has the reference voltage applied to the base thereof,
a fourth transistor having the emitter connected to the emitter of the third transistor, and
a second current source transistor having the collector connected to the common emitters of the third and fourth transistors for determining the amount of current which flows in both the third and fourth transistors; and (c) a current generator circuit for supplying a current in response to the output current of the second differential amplifier circuit to the bases of both the first and second transistors, the current generator circuit including,
a fifth transistor having the base connected to the base of the fourth transistor for delivering a current larger than the current delivered from the fourth transistor,
a sixth transistor for supplying a base current to the fifth transistor in response to the output current of the second differential amplifier circuit, and
seventh and eighth transistors having the base and emitters respectively connected to the base and emitter of the sixth transistor for supplying a current to the bases of both the first and second transistors.

2. An amplifier circuit according to claim 1, wherein the first, second and fifth transistors have identical characteristics.

3. An amplifier circuit according to claim 2, wherein a third current source transistor is provided at the emitter of the fifth transistor for serving to supply half of the current of the first current source transistor to the fifth transistor.

4. An amplifier circuit according to claim 3, wherein the amount of current of the second current source transistor is selected to be less than 1/5 of the current of the third transistor.

5. An amplifier circuit according to claim 1, wherein the amplifier circuit is a multistage amplifier.

* * * * *